(12) United States Patent
Peng et al.

(10) Patent No.: US 11,169,579 B2
(45) Date of Patent: Nov. 9, 2021

(54) SHAFT ASSEMBLY AND ELECTRONIC DEVICE INCLUDING THE SAME

(71) Applicants: INVENTEC (PUDONG) TECHNOLOGY CORPORATION, Shanghai (CN); INVENTEC CORPORATION, Taipei (TW)

(72) Inventors: Chi Zen Peng, Taipei (TW); Chun-hsiang Yeh, Taipei (TW); Jian-Ming Peng, Taipei (TW); Chih-yu Chen, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 16/874,548

(22) Filed: May 14, 2020

(65) Prior Publication Data

US 2021/0232182 A1 Jul. 29, 2021

(30) Foreign Application Priority Data

Jan. 23, 2020 (CN) .......................... 202010076600.1

(51) Int. Cl.
*H05K 5/00* (2006.01)
*G06F 1/16* (2006.01)
*H05K 5/02* (2006.01)
*H05K 7/16* (2006.01)

(52) U.S. Cl.
CPC ......... *G06F 1/1681* (2013.01); *H05K 5/0017* (2013.01); *H05K 5/0226* (2013.01); *H05K 7/16* (2013.01)

(58) Field of Classification Search
None
See application file for complete search history.

(56) References Cited

U.S. PATENT DOCUMENTS

| | | | | |
|---|---|---|---|---|
| 6,223,393 B1 * | 5/2001 | Knopf | .................. | G06F 1/1618 16/366 |
| 7,515,707 B2 * | 4/2009 | Ka | ........................ | G06F 1/1616 16/366 |
| 8,773,849 B2 * | 7/2014 | Bohn | .................. | H04M 1/0274 361/679.28 |
| 9,535,465 B2 * | 1/2017 | Bohn | .................... | H04M 1/022 |
| 9,606,583 B2 * | 3/2017 | Ahn | ...................... | G06F 1/1652 |
| 9,891,672 B2 * | 2/2018 | Hampton | .............. | G06F 1/1681 |

(Continued)

*Primary Examiner* — Anthony Q Edwards
*Assistant Examiner* — Rashen E Morrison
(74) *Attorney, Agent, or Firm* — Maschoff Brennan

(57) ABSTRACT

A shaft assembly that pivotally couples a first module body to a second module body includes two double shaft hinges and a main cover plate. One end of each double shaft hinge pivotally couples to the first module body, and another end pivotally couples to the second module body. The first module body is pivotable about a first axis with respect to the second module body via the double shaft hinges, and the second module body is pivotable about a second axis with respect to the first module body via the double shaft hinges. The first axis parallels the second axis, and the first axis is closer to the first module body than the second axis to the first module body. The main cover plate is located between the two double shaft hinges, and two ends of the main cover plate are respectively connected to the two double shaft hinges.

12 Claims, 7 Drawing Sheets

(56) References Cited

U.S. PATENT DOCUMENTS

| | | | | |
|---|---|---|---|---|
| 10,337,224 B1* | 7/2019 | Shah | ............... | E05D 11/105 |
| 10,401,926 B1* | 9/2019 | North | ............... | G06F 1/1616 |
| 10,760,311 B2* | 9/2020 | Regimbal | ............... | G06F 1/1683 |
| 2006/0063572 A1* | 3/2006 | Garcia | ............... | H04M 1/0216 |
| | | | | 455/575.3 |

* cited by examiner

SHAFT ASSEMBLY AND ELECTRONIC DEVICE INCLUDING THE SAME

CROSS-REFERENCE TO RELATED APPLICATIONS

This non-provisional application claims priority under 35 U.S.C. § 119(a) on Patent Application No(s). 202010076600.1 filed in China on Jan. 23, 2020, the entire contents of which are hereby incorporated by reference.

TECHNICAL FIELD

This disclosure relates to a shaft assembly and an electronic device, more particularly relates to a shaft assembly covering the cables connected between the main body and the screen and an electronic device including the shaft assembly.

BACKGROUND

Currently, many electronic products in the market are designed in a foldable way, and foldable electronic products are also a trend in the market today. Take a laptop as an example, the screen and the main body are generally connected to each other via a pivot. When a user is going to use a laptop, the user only needs to unfold the screen with respect to the main body to use it. When not using the laptop, the user can fold the screen and the main body to reduce the space occupied by the laptop and easy to store and carry it.

In the design of thin and light laptops, using fanless systems and flexible flat cables instead of conventional wires is a trend in the future. The fanless system conducts heat generated from the main body to the case of the screen via a flexible heat conductive component, such as a graphite sheet. However, laptops with fanless systems or flexible flat cables in the current market usually expose part of the cables or flexible heat conductive components at the junction of the screen and the main body, and it causes a defect in appearance and safety. Therefore, researchers in the art are devoted to solving the problems mentioned above.

SUMMARY

The disclosure provides a shaft assembly and an electronic device so as to solve the problem that an electronic device, such as a laptop, usually exposes part of the cables or flexible heat conductive components at the junction of its screen and main body in the prior art.

One embodiment of the present disclosure provides a shaft assembly configured to pivotally couple a first module body to a second module body. The shaft assembly includes two double shaft hinges and a main cover plate. One end of each of the double shaft hinges is configured to be pivotally coupled to the first module body, and another end of the double shaft hinges is configured to be pivotally coupled to the second module body. The first module body is pivotable about a first axis with respect to the second module body via the two double shaft hinges, and the second module body is pivotable about a second axis with respect to the first module body via the two double shaft hinges. The first axis parallels the second axis, and the first axis is closer to the first module body than the second axis to the first module body. The main cover plate is located between the two double shaft hinges, and two ends of the main cover plate respectively connected to the two double shaft hinges. The main cover plate is located on one side of a reference plane where both the first axis and the second axis are located.

Another embodiment of the present disclosure provides an electronic device including a first module body, a second module body, and a shaft assembly. The shaft assembly includes two double shaft hinges and a main cover plate. One end of each of the double shaft hinges is pivotally coupled to the first module body, and another end of the double shaft hinges is pivotally coupled to the second module body. The first module body is pivotable about a first axis with respect to the second module body via the two double shaft hinges, and the second module body is pivotable about a second axis with respect to the first module body via the two double shaft hinges. The first axis parallels the second axis, and the first axis is closer to the first module body than the second axis to the first module body. The main cover plate is located between the two double shaft hinges, and two ends of the main cover plate respectively connected to the two double shaft hinges. The main cover plate is located on one side of a reference plane where both the first axis and the second axis are located.

According to the aforementioned embodiments of the present disclosure, the shaft assembly and the electronic device are able to cover flexible heat conductive components connected between the first module body and the second module body by disposing the main cover plate connected to the two double shaft hinges between the first module body and the second module body so as to reduce the area of the flexible heat conductive components exposed to the outside, thereby achieving the purpose for hiding and protecting the flexible heat conductive components, and further meeting the requirements of an electronic device for overall appearance and safety.

The aforementioned content of the present disclosure and the following embodiments are used to demonstrate and explain the principle of the present disclosure, and provide a further explanation for the claims of the present disclosure.

BRIEF DESCRIPTION OF THE DRAWINGS

The present disclosure will become better understood from the detailed description given hereinbelow and the accompanying drawings which are given by way of illustration only and thus are not intended to limit the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
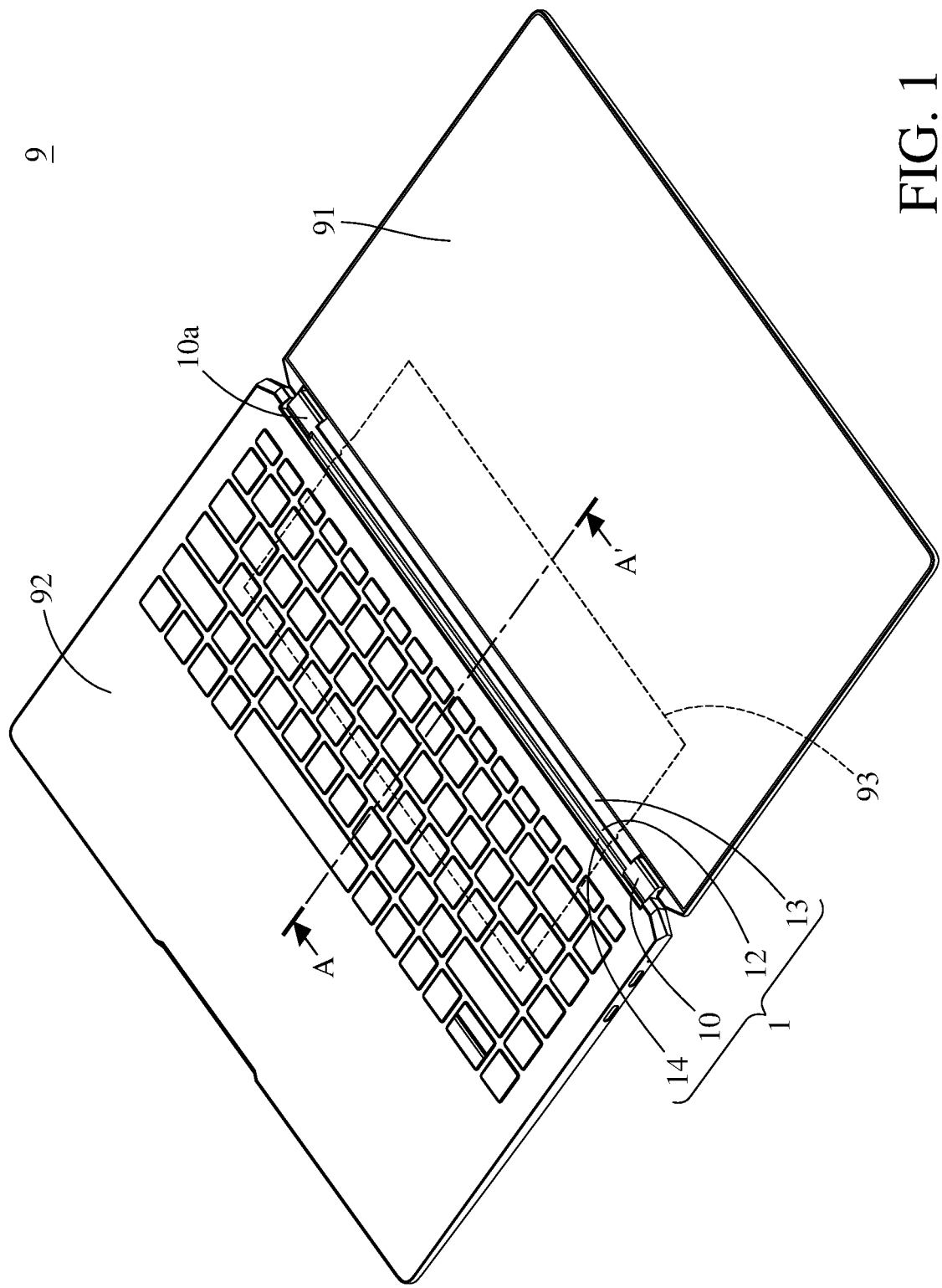
FIG. 1 is a schematic perspective view of an electronic device according to one embodiment of the present disclosure.
Figure 2:
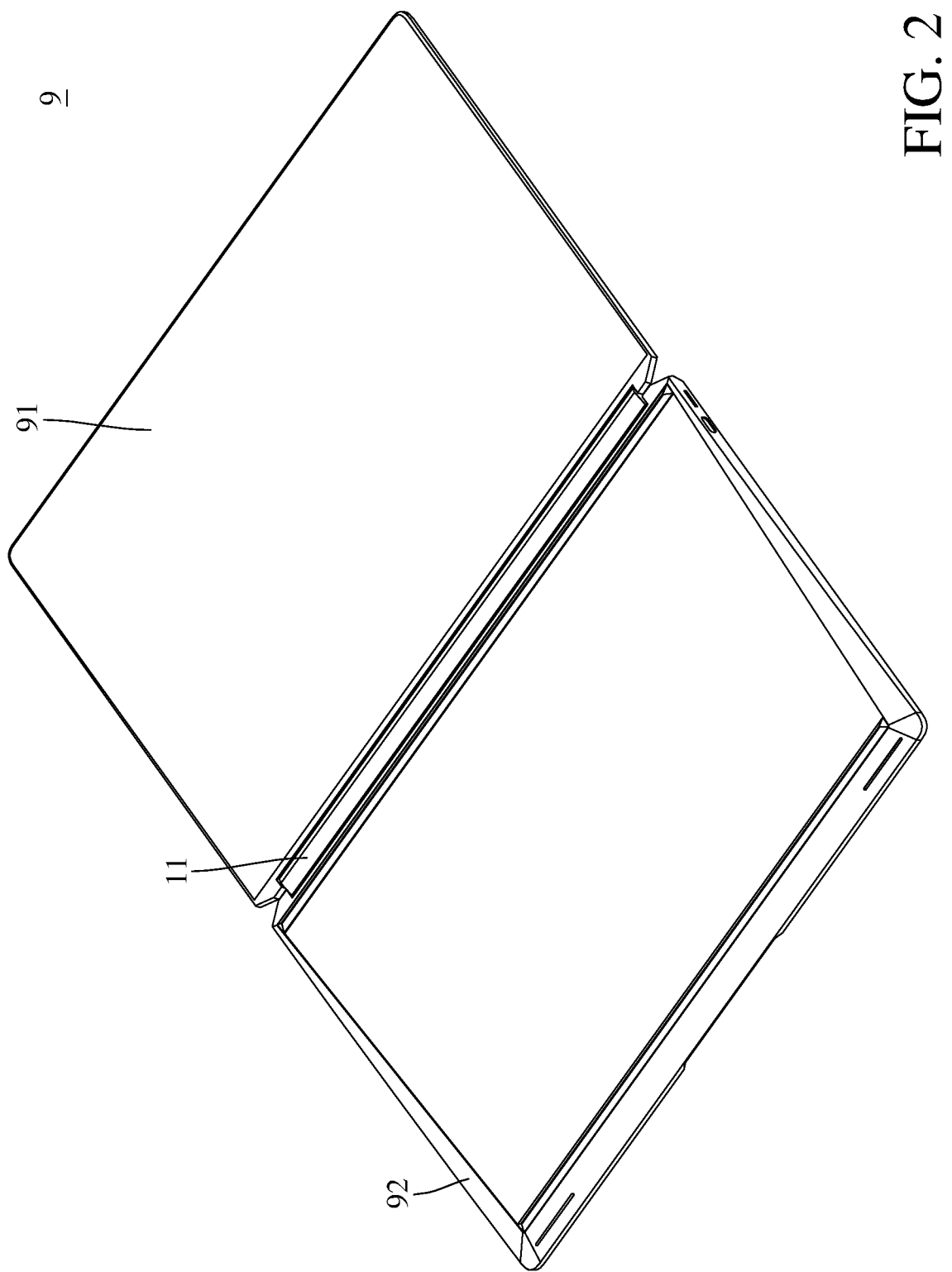
FIG. 2 is another schematic perspective view of the electronic device in FIG. 1.
Figure 3:
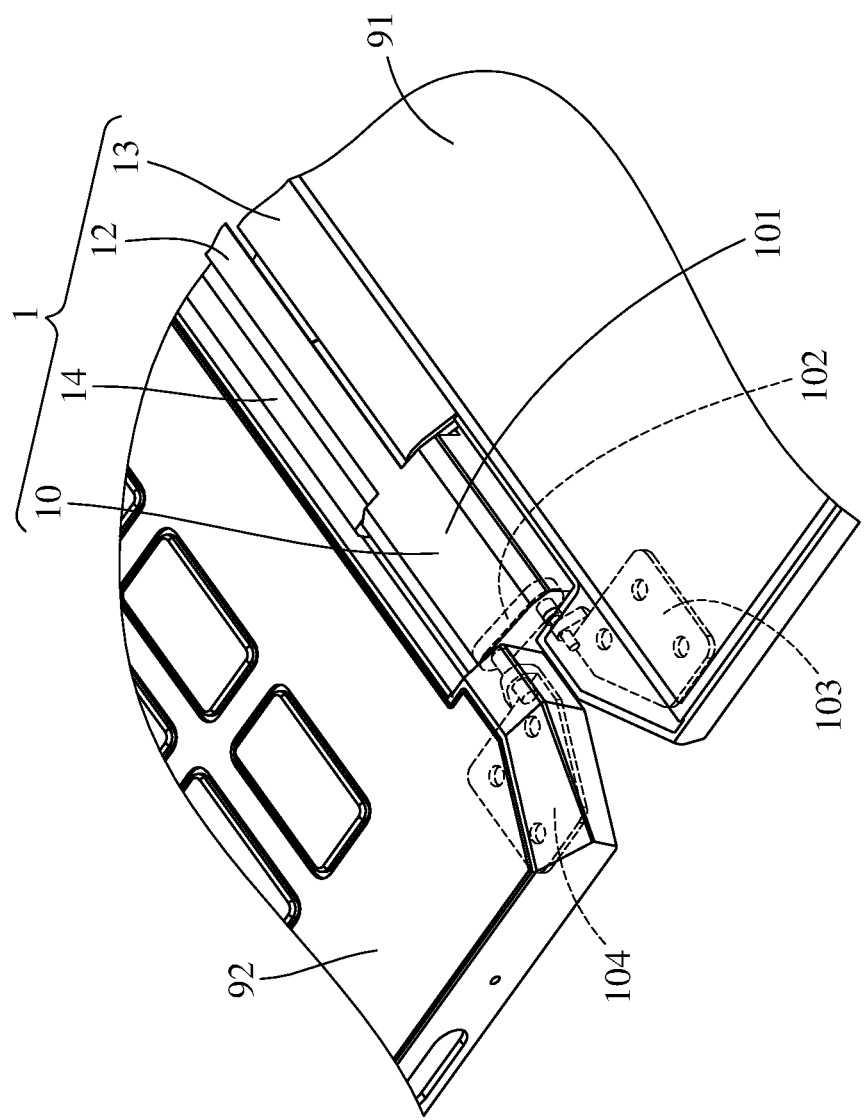
FIG. 3 is a partially enlarged view of the electronic device in FIG. 1.
Figure 4:
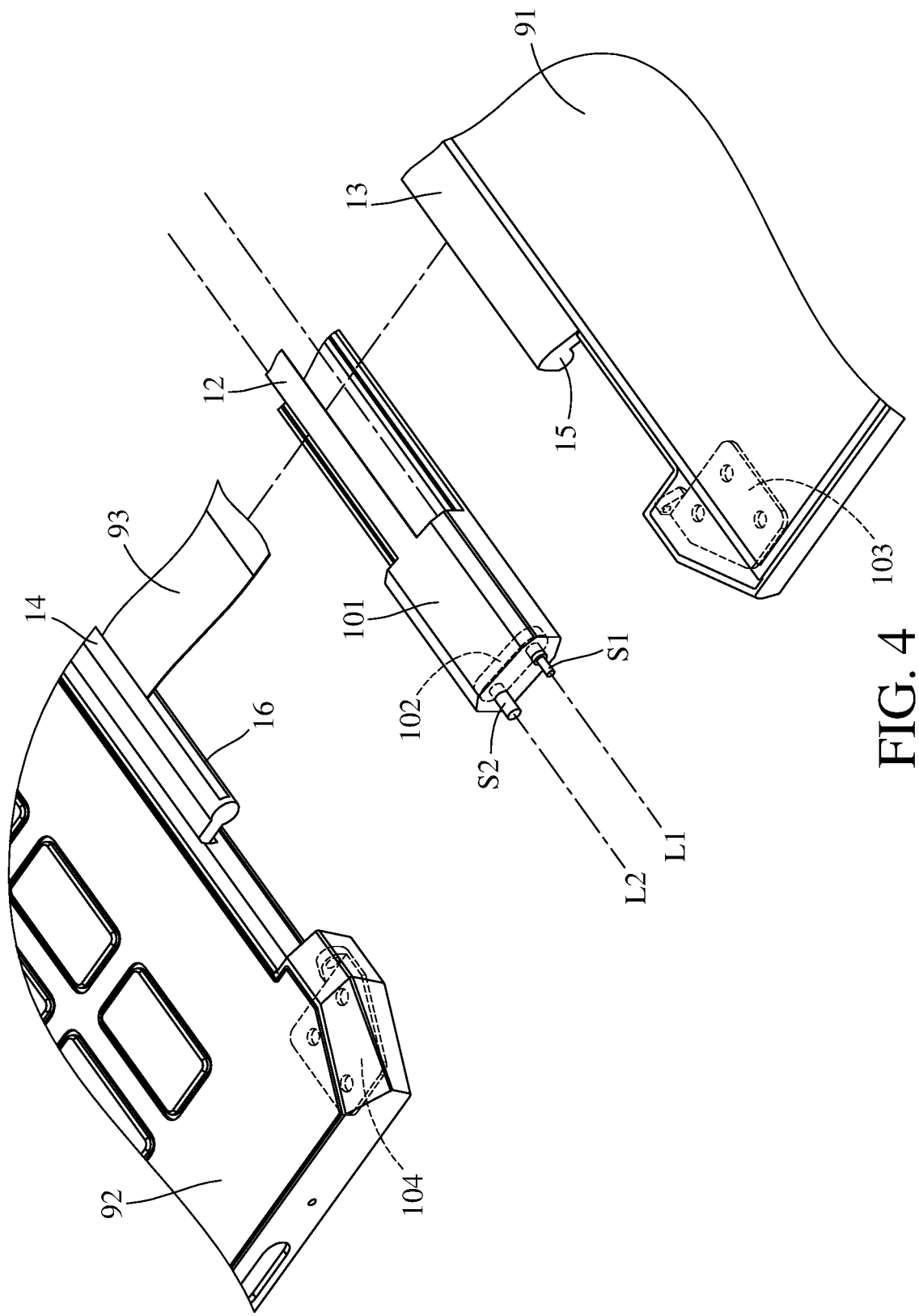
FIG. 4 is a partially enlarged exploded view of the electronic device in FIG. 1.

Please refer to FIGS. 1 to 4. FIG. 1 is a schematic perspective view of an electronic device according to one embodiment of the present disclosure. FIG. 2 is another schematic perspective view of the electronic device in FIG. 1. FIG. 3 is a partially enlarged view of the electronic device in FIG. 1. FIG. 4 is a partially enlarged exploded view of the electronic device in FIG. 1.

In this embodiment, an electronic device 9 is provided. The electronic device 9 includes a first module body 91, a second module body 92, a flexible heat conductive component 93, and a shaft assembly 1. In this embodiment, the electronic device 9 is a laptop with a fanless system, and the first module body 91 and the second module body 92 may respectively be a screen and a main body which are pivotable with respect to each other, but the present disclosure is not limited thereto. In other embodiments, the electronic device may be an electronic device with two or more bodies pivotable with respect to each other, such as a mobile phone or a tablet.

The flexible heat conductive component 93 may be a graphite sheet, a copper foil, an aluminum foil or a metal wire mesh, for example. The flexible heat conductive component 93 includes two mounting parts and a flexible part connected between the two mounting parts, and the two mounting parts are, for example, respectively connected to a heat source in an inner space of one of the first module body 91 and the second module body 92 and an inner surface of a case of the other. The heat source may be a central processing unit (CPU) or a graphics processing unit (GPU), and the case may be a metal case with high thermal conductivity.

The shaft assembly 1 includes two double shaft hinges 10 and 10a, a first main cover plate 11, a second main cover plate 12, a first secondary cover plate 13, a second secondary cover plate 14, a third secondary cover plate 15, and a fourth secondary cover plate 16.

Each of the double shaft hinges 10 and 10a includes a case 101, a connector 102, a first mounting frame 103, and a second mounting frame 104. The connector 102 is fixed in the case 101, and the connector 102 includes a first pivot S1 with a first axis L1 as an axle center and a second pivot S2 with a second axis L2 as an axle center. One end of the first mounting frame 103 is pivotally coupled to the first pivot S1 and the first mounting frame 103 is pivotable about the first axis L1, and the other end of the first mounting frame 103 is fixed on the first module body 91. One end of the second mounting frame 104 is pivotally coupled to the second pivot S2 and the second mounting frame 104 is pivotable about the second axis L2, and the other end of the second mounting frame 104 is fixed on the second module body 92. The first axis L1 parallels the second axis L2, and the first axis L1 is closer to the first module body 91 than the second axis L2 to the first module body 91. As such, the first module body 91 is pivotable about the first axis L1 with respect to the second module body 92 via the double shaft hinges 10 and 10a, and the second module body 92 is pivotable about the second axis L2 with respect to the first module body 91 via the double shaft hinges 10 and 10a.

Figure 5:
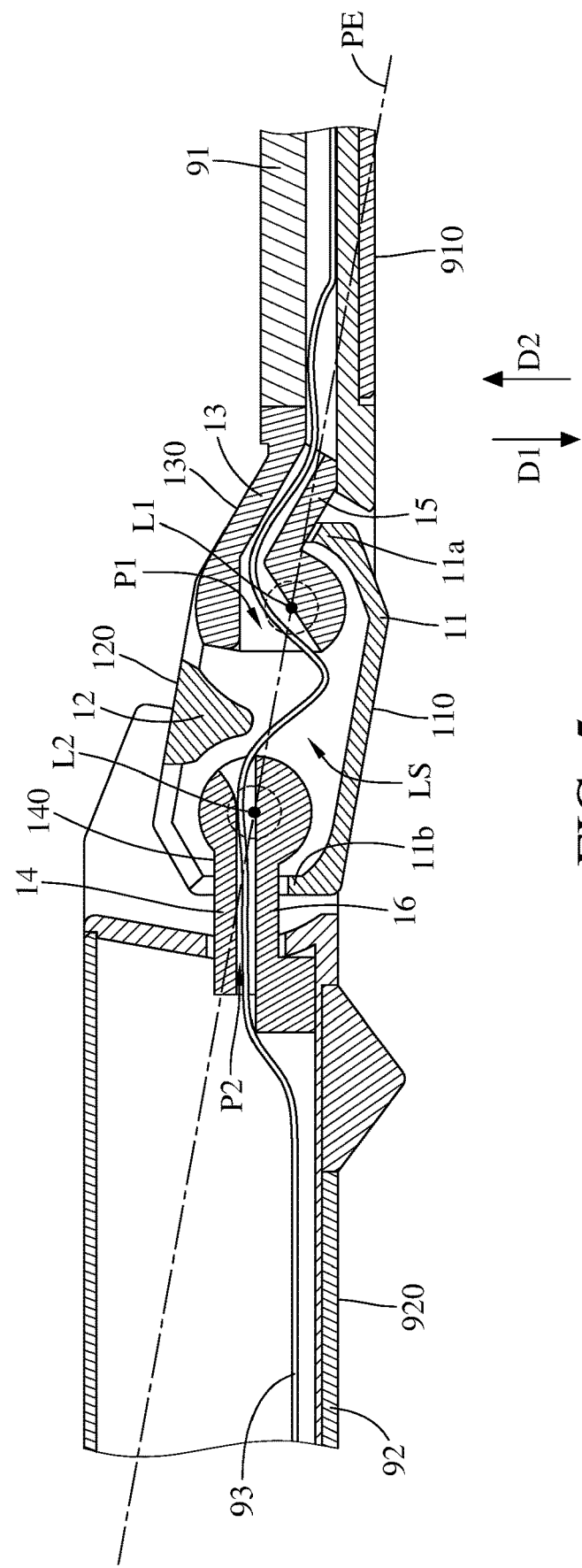
FIG. 5 is a partially enlarged cross-sectional view of the electronic device in FIG. 1 along line A-A'.

Please also refer to FIG. 5. FIG. 5 is a partially enlarged cross-sectional view of the electronic device in FIG. 1 along line A-A'. The first main cover plate 11, the second main cover plate 12, the first secondary cover plate 13, the second secondary cover plate 14, the third secondary cover plate 15, and the fourth secondary cover plate 16 are all located between the double shaft hinges 10 and 10a and together form a wiring space LS between the double shaft hinges 10 and 10a.

Two ends of the first main cover plate 11 are respectively connected to the cases 101 of the double shaft hinges 10 and 10a, and two ends of the second main cover plate 12 are respectively connected to the cases 101 of the double shaft hinges 10 and 10a. The first main cover plate 11 and the second main cover plate 12 are respectively located on two opposite sides of a reference plane PE where both the first axis L1 and the second axis L2 are located.

The first secondary cover plate 13 is fixed on the first module body 91 and located on a side of the first module body 91 closer to the double shaft hinges 10 and 10a. The third secondary cover plate 15 is fixed on the first secondary cover plate 13 and together form a first passage P1 connected to the wiring space LS. The first passage P1 is connected to the inner space of the first module body 91. The fourth secondary cover plate 16 is fixed on the second module body 92 and located on a side of the second module body 92 closer to the double shaft hinges 10 and 10a. The second secondary cover plate 14 is fixed on the fourth secondary cover plate 16 and together form a second passage P2 connected to the wiring space LS. The second passage P2 is connected to the inner space of the second module body 92. The first passage P1, the wiring space LS, and the second passage P2 may be provided for the flexible part of the flexible heat conductive component 93 to pass through, but the present disclosure is not limited thereto. In other embodiments, the first passage P1, the wiring space LS, and the second passage P2 may also be provided for flexible wires to pass through, such as flexible flat cables (FFC) or flexible printed circuit (FPC).

In this embodiment, the first main cover plate 11, the second main cover plate 12 and the cases 101 of the double shaft hinges 10 and 10a are one-piece formed, but the present disclosure is not limited thereto. In other embodiments, the first main cover plate and the second main cover plate may be independent components and respectively connected to the cases of the double shaft hinges by a fixing means.

In this embodiment, the first secondary cover plate 13 and the third secondary cover plate 15 are one-piece formed as a single component, and the second secondary cover plate 14 and the fourth secondary cover plate 16 are one-piece formed as a single component, but the present disclosure is not limited thereto. In other embodiments, the first secondary cover plate and the third secondary cover plate may also be two independent components and connected to each other by a fixing means, or the first secondary cover plate and the third secondary cover plate may be respectively directly fixed on the first module body. In addition, the second secondary cover plate and the fourth secondary cover plate may also be two independent components and connected to each other by a fixing means, or the second secondary cover plate and the fourth secondary cover plate may be respectively directly fixed on the second module body.

Figure 6:
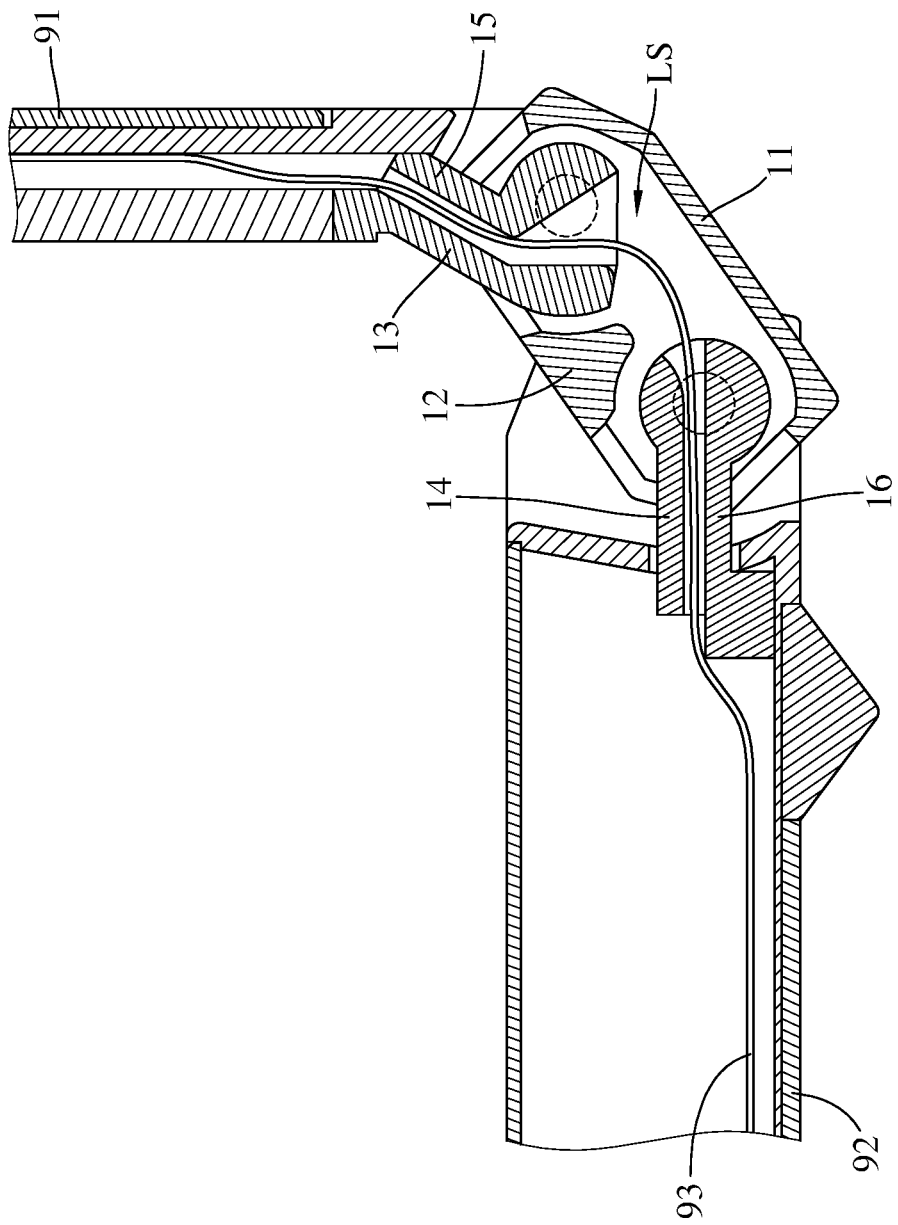
FIG. 6 is a partially enlarged cross-sectional view of the electronic device in FIG. 1 with an angle of 90 degrees between the first module body and the second module body.
Figure 7:
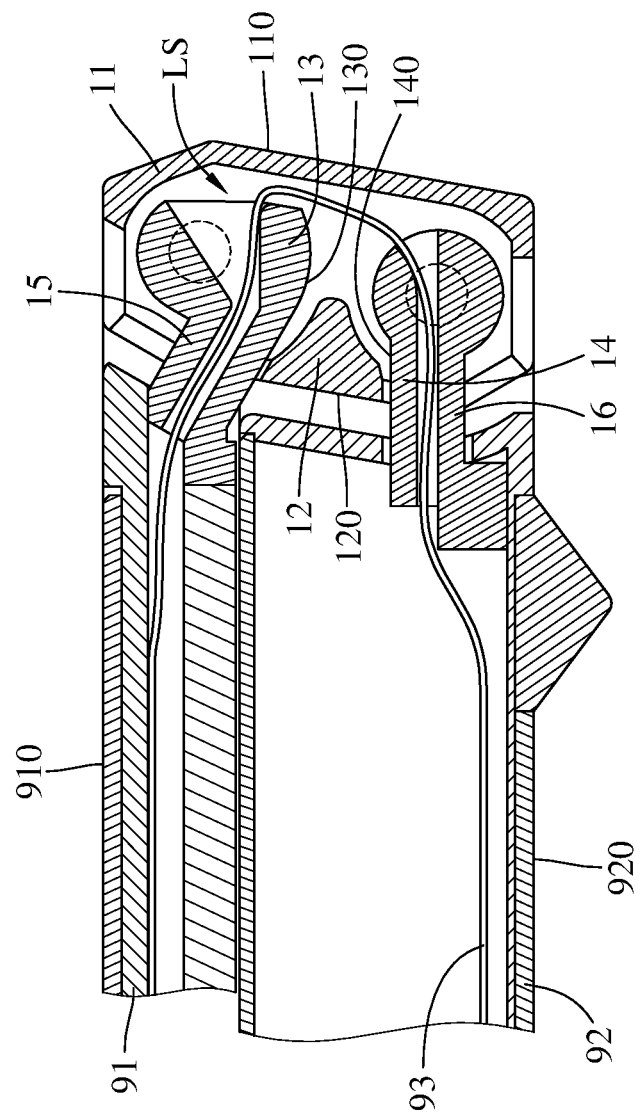
FIG. 7 is a partially enlarged cross-sectional view of the electronic device in FIG. 1 with the first module body in a closed state.

Please refer to FIGS. 5 to 7. FIG. 5 is a partially enlarged cross-sectional view of the electronic device in FIG. 1 along line A-A'. FIG. 6 is a partially enlarged cross-sectional view of the electronic device in FIG. 1 with an angle of 90 degrees between the first module body and the second module. FIG. 7 is a partially enlarged cross-sectional view of the electronic device in FIG. 1 with the first module body in a closed state. FIG. 5 may be seen as a partially enlarged cross-sectional view of the electronic device in FIG. 1 with the first module body in a flat open state.

The first module body 91 has a closed state (as shown in FIG. 7) and a flat open state (as shown in FIG. 5). The closed state refers that the angle between the first module body 91 and the second module body 92 is 0 degree, for example. The flat open state refers that the angle between the first module body 91 and the second module body 92 is 180 degrees, for example. When the first module body 91 is in the closed state, a back surface 910 of the first module body 91, a contact bottom surface 920 of the second module body 92 and a first outer surface 110 of the first main cover plate 11 respectively face three different directions, and a second outer surface 120 of the second main cover plate 12, a third outer surface 130 of the first secondary cover plate 13 and a fourth outer surface 140 of the second secondary cover plate 14 respectively face three different directions. When the first module body 91 is in the flat open state, the back surface 910 of the first module body 91, the contact bottom surface 920 of the second module body 92 and the first outer surface 110 of the first main cover plate 11 substantially all face a first direction D1, and the second outer surface 120 of the second main cover plate 12, the third outer surface 130 of the first secondary cover plate 13 and the fourth outer surface 140 of the second secondary cover plate 14 substantially all face a second direction D2 opposite to the first direction D1. For example, when the electronic device 9 is placed on the desk and the first module body 91 is in the flat open state, the back surface 910 of the first module body 91, the contact bottom surface 920 of the second module body 92 and the first outer surface 110 of the first main cover plate 11 all face the desk, and the second outer surface 120 of the second main cover plate 12, the third outer surface 130 of the first secondary cover plate 13 and the fourth outer surface 140 of the second secondary cover plate 14 all face away from the desk.

As shown in FIG. 5, when the first module body 91 is in the flat open state, the second main cover plate 12, the first secondary cover plate 13 and the second secondary cover plate 14 together constitute an upper cover portion, and the first axis L1 and the second axis L2 are both located between the upper cover portion and the first main cover plate 11. As such, when the first module body 91 is in the flat open state, the first main cover plate 11, the second main cover plate 12, the first secondary cover plate 13 and the second secondary cover plate 14 together cover the flexible part of the flexible heat conductive component 93 in the wiring space LS so as to reduce the area of the flexible heat conductive component 93 exposed to the outside, and thus achieving the purpose for hiding and protecting the flexible heat conductive component 93.

In addition, as shown in FIG. 7, when the first module body 91 is in the closed state, the first main cover plate 11, the second main cover plate 12, the third secondary cover plate 15 and the fourth secondary cover plate 16 together surround the wiring space LS. As such, when the first module body 91 is in the closed state, the first main cover plate 11, the second main cover plate 12, the third secondary cover plate 15 and the fourth secondary cover plate 16 together cover the flexible part of the flexible heat conductive component 93 in the wiring space LS so as to reduce the area of the flexible heat conductive component 93 exposed to the outside.

In addition, as shown in FIG. 6, when the angle between the first module body 91 and the second module body 92 is, for example, 90 degrees, the first main cover plate 11, the second main cover plate 12, the first secondary cover plate 13, the second secondary cover plate 14, the third secondary cover plate 15 and the fourth secondary cover plate 16 together surround the wiring space LS to cover the flexible part of the flexible heat conductive component 93 so as to reduce the area of the flexible heat conductive component 93 exposed to the outside. FIG. 6 shows a schematic view with an angle of 90 degrees between the first module body 91 and the second module body 92. However, according to FIGS. 5 to 7 and the description above, it should be understood that no matter what angle ranging from 0 to 180 degrees the first module body 91 is pivoted at relative to the second module body 92, the flexible part of the flexible heat conductive component 93 in the wiring space LS may also be covered by the first main cover plate 11, the second main cover plate 12, the first secondary cover plate 13, the second secondary cover plate 14, the third secondary cover plate 15 and the fourth secondary cover plate 16.

In this embodiment, the first secondary cover plate 13, the second secondary cover plate 14, the third secondary cover plate 15 and the fourth secondary cover 16 respectively extend from the double shaft hinge 10 to the double shaft hinge 10a so as to cover a large area of the wiring space LS between the double shaft hinges 10 and 10a, but the present disclosure is not limited thereto. In other embodiments, the first secondary cover plate, the second secondary cover plate, the third secondary cover plate and the fourth secondary cover plate may be designed in different extension lengths depending on the area actually required to be covered.

In this embodiment, the second main cover plate 12 has a rib protruding toward the first main cover plate 11 so as to enhance the structural strength of the second main cover plate 12, but the present disclosure is not limited thereto. In other embodiments, the rib of the second main cover plate may be optional.

In this embodiment, the first main cover plate 11, the second main cover plate 12 and the cases 101 of the double shaft hinges 10 and 10a are made of metallic material so as to enhance the structural strength of the first main cover plate 11, the second main cover plate 12 and the cases 101, but the present disclosure is not limited thereto. In other embodiments, the first main cover plate 11, the second main cover plate 12 and the cases 101 of the double shaft hinges 10 and 10a may be made of plastic material, for example.

In this embodiment, the first module body 91 of the electronic device 9 is pivotable by 180 degrees with respect to the second module body 92. In detail, the first main cover plate 11 has two stopper portions 11a and 11b at two ends thereof substantially parallel to a reference line which is perpendicular to both the first axis L1 and second axis L2, and the stopper portions 11a and 11b extend toward the reference plane PE. As shown in FIG. 5, when the first module body 91 is pivoted from the closed state to the flat open state with respect to the second module body 92, the stopper portions 11a and 11b of the first main cover plate 11 may respectively interfere with the third secondary cover plate 15 and the fourth secondary cover plate 16 so as to restrict the pivoting angle of the first module body 91 with respect to the second module body 92, but the present disclosure is not limited thereto. In other embodiments, the extending length of the stopper portion of the first main cover plate may be designed depending on the actual product requirement, so that the first module body may have a different maximum pivoting angle with respect to the second module body.

In this embodiment, the double shaft hinges 10 and 10a include first and second mounting frames 103 and 104 for mounting on the first module body 91 and the second module body 92, but the present disclosure is not limited by the configuration of the double shaft hinges 10 and 10a. In other embodiments, the two pivots of each of the double shaft hinges may be respectively directly pivotably coupled to the case of the first module body and the second module body, for example.

In this embodiment, the shaft assembly 1 includes the first and the second main cover plates and the first to fourth secondary cover plates (11, 12, 13, 14, 15, and 16), but the present disclosure is not limited thereto. In other embodiments, the shaft assembly may be designed to only include a main cover plate (that is, the aforementioned first main cover plate 11 or second main cover plate 12) on one side of the reference plane where both the first axis and the second axis are located depending on the actual requirement so as to reduce the area of the flexible heat conductive component or cables exposed to the outside. Alternatively, in other embodiments, in addition to the aforementioned first main cover plate and second main cover plate, the shaft assembly may be designed to further include one or more of the aforementioned first to fourth secondary cover plates.

According to the shaft assembly and the electronic device as described above, the shaft assembly and the electronic device are able to cover flexible heat conductive components connected between the first module body and the second module body by disposing one or more cover plates fixed on the module body or on the double shaft hinges between the first module body and the second module body so as to reduce the area of the flexible heat conductive components exposed to the outside, thereby achieving the purpose for hiding and protecting the flexible heat conductive components, and further meeting the requirements of an electronic device for overall appearance and safety.

In addition, in the embodiments of the shaft assembly including the first main cover plate, the second main cover plate, the first secondary cover plate and the second secondary cover plate, since the second main cover plate, the first secondary cover plate and the second secondary cover plate together constitute the upper cover portion and the first axis and the second axis are both located between the upper cover portion and the first main cover plate when the first module body is in the flat open state, the upper cover portion and the first main cover plate together cover the flexible part of the flexible heat conductive component in the wiring space, thereby reducing the area of the flexible heat conductive component exposed to the outside and thus achieving the purpose for hiding and protecting the flexible heat conductive component.

In addition, in the embodiments of the shaft assembly including the first main cover plate, the second main cover plate, the third secondary cover plate and the fourth secondary cover plate, since the first main cover plate, the second main cover plate, the third secondary cover plate and the fourth secondary cover plate together surround the wiring space when the first module body is in the closed state, the first main cover plate, the second main cover plate, the third secondary cover plate and the fourth secondary cover plate together cover the flexible part of the flexible heat conductive component in the wiring space, thereby reducing the area of the flexible heat conductive component exposed to the outside and thus achieving the purpose for hiding and protecting the flexible heat conductive component.

Further, in the embodiments of the shaft assembly including the first main cover plate, the second main cover plate, the first secondary cover plate, the second secondary cover plate, the third secondary cover plate and the fourth secondary cover plate, since the first main cover plate, the second main cover plate, the first secondary cover plate, the second secondary cover plate, the third secondary cover plate and the fourth secondary cover plate together surround the wiring space when the first module body is at any angle between 0 and 180 degrees to the second module body, the first to fourth secondary cover plates together cover the flexible part of the flexible heat conductive component in the wiring space, thereby reducing the area of the flexible heat conductive component exposed to the outside and thus achieving the purpose for hiding and protecting the flexible heat conductive component.

In addition, in some embodiments, the first secondary cover plate, the second secondary cover plate, the third secondary cover plate and the fourth secondary cover plate respectively extend from one of the double shaft hinges to the other so as to cover a large area of the wiring space between the first module body, the second module body and the double shaft hinges, thereby reducing the area of the flexible heat conductive component exposed to the outside.

Though the embodiment according to the present disclosure is described above, the present disclosure is not limited thereto. Without departing from the spirit and scope of the present disclosure, any skilled person in the field can do some appropriate change in the shapes, structures, characteristics and spirits. The extent of patent protection subject to the claim in the specification.

What is claimed is:

1. A shaft assembly, configured to pivotally couple a first module body to a second module body, comprising:
   two double shaft hinges, one end of each of the double shaft hinges configured to be pivotally coupled to the first module body, another end of each of the double shaft hinges configured to be pivotally coupled to the second module body, wherein the first module body is pivotable about a first axis with respect to the second module body via the two double shaft hinges, the second module body is pivotable about a second axis with respect to the first module body via the two double shaft hinges, the first axis parallels the second axis, and the first axis is closer to the first module body than the second axis to the first module body; and
   a main cover plate, located between the two double shaft hinges, and two ends of the main cover plate respectively connected to the two double shaft hinges;
   wherein the main cover plate is located on one side of a reference plane where both the first axis and the second axis are located;
   wherein the shaft assembly further comprises a first secondary cover plate and a second secondary cover plate located between the two double shaft hinges, the first secondary cover plate is configured to be fixed on the first module body and located on one side of the first module body closer to the two double shaft hinges, and the second secondary cover plate is configured to be fixed on the second module body and located on one side of the second module body closer to the two double shaft hinges.

2. The shaft assembly of claim 1, wherein the main cover plate is a first main cover plate, the shaft assembly further comprises a second main cover plate located between the two double shaft hinges, two ends of the second main cover plate are respectively connected to the two double shaft hinges, and the first main cover plate and the second main cover plate are respectively located on two opposite sides of the reference plane where both the first axis and the second axis are located.

3. The shaft assembly of claim 1, wherein the main cover plate is a first main cover plate, the shaft assembly further comprises a second main cover plate located between the two double shaft hinges, two ends of the second main cover plate are respectively connected to the two double shaft hinges, the first main cover plate and the second main cover plate are respectively located on two opposite sides of the reference plane where both the first axis and the second axis are located, the first module body has a closed state and an flat open state; when the first module body is in the closed state, a back surface of the first module body, a contact bottom surface of the second module body and a first outer surface of the first main cover plate respectively face three different directions, and a second outer surface of the second main cover plate, a third outer surface of the first secondary cover plate and a fourth outer surface of the second secondary cover plate respectively face three different directions; when the first module body is in the flat open state, the back surface of the first module body, the contact bottom surface of the second module body and the first outer surface of the first main cover plate substantially all face a first direction, the second outer surface of the second main cover plate, the third outer surface of the first secondary cover plate and the fourth outer surface of the second secondary cover plate substantially all face a second direction opposite to the first direction, and the first main cover plate, the second main cover plate, the first secondary cover plate and the second secondary cover plate together form a wiring space.

4. The shaft assembly of claim 3, wherein the first secondary cover plate and the second secondary cover plate respectively extend from one of the two double shaft hinges to the other of the two double shaft hinges.

5. The shaft assembly of claim 3, further comprising a third secondary cover plate and a fourth secondary cover plate located between the two double shaft hinges, wherein the third secondary cover plate is fixed on the first secondary cover plate, the third secondary cover plate and the first secondary cover plate together form a first passage connected to the wiring space, the fourth secondary cover plate is configured to be fixed on the second module body, the second secondary cover plate is fixed on the second module body by being fixed on the fourth secondary cover plate, the second secondary cover plate and the fourth secondary cover plate together form a second passage connected to the wiring space, the first passage is configured to be connected to an inner space of the first module body, and the second passage is configured to be connected to an inner space of the second module body.

6. The shaft assembly of claim 5, wherein when the first module body is in the closed state, the first main cover plate, the second main cover plate, the third secondary cover plate and the fourth secondary cover plate surround the wiring space.

7. The shaft assembly of claim 5, wherein the first secondary cover plate, the second secondary cover plate, the third secondary cover plate, and the fourth secondary cover plate respectively extend from one of the two double shaft hinges to the other of the two double shaft hinges.

8. The shaft assembly of claim 5, wherein the first secondary cover plate and the third secondary cover plate are one-piece formed, and the second secondary cover plate and the fourth secondary cover plate are one-piece formed.

9. The shaft assembly of claim 3, wherein when the first module body is in the flat open state, the second main cover plate, the first secondary cover plate and the second secondary cover plate constitute an upper cover portion, and the first axis and the second axis are both located between the upper cover portion and the first main cover plate.

10. The shaft assembly of claim 1, wherein the first secondary cover plate and the second secondary cover plate respectively extend from one of the two double shaft hinges to the other of the two double shaft hinges.

11. The shaft assembly of claim 2, wherein each of the two double shaft hinges comprises a case, a connector, a first mounting frame, and a second mounting frame, the connector is fixed in the case, the connector comprises a first pivot with the first axis as an axle center and a second pivot with the second axis an axle center, one end of the first mounting frame is pivotally coupled to the first pivot and the first mounting frame is pivotable about the first axis, another end of the first mounting frame is configured to be fixed on the first module body, one end of the second mounting frame is pivotally coupled to the second pivot and the second mounting frame is pivotable about the second axis as an axle center, another end of the second mounting frame is configured to be fixed on the second module body, two ends of the first main cover plate are respectively connected to the two cases of the two double shaft hinges, and two ends of the second main cover plate are respectively connected to the two cases of the two double shaft hinges.

12. The shaft assembly of claim 11, wherein the first main cover plate and the two cases of the two double shaft hinges are one-piece formed, and the second main cover plate and the two cases of the two double shaft hinges are one-piece formed.

* * * * *